United States Patent
Lv et al.

(10) Patent No.: US 10,663,857 B2
(45) Date of Patent: May 26, 2020

(54) MASK AND FABRICATION METHOD THEREOF

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Shouhua Lv, Beijing (CN); Baojun Li, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/548,832

(22) PCT Filed: Feb. 22, 2017

(86) PCT No.: PCT/CN2017/074403
§ 371 (c)(1),
(2) Date: Aug. 4, 2017

(87) PCT Pub. No.: WO2018/014554
PCT Pub. Date: Jan. 25, 2018

(65) Prior Publication Data
US 2018/0239241 A1    Aug. 23, 2018

(30) Foreign Application Priority Data
Jul. 22, 2016  (CN) .......................... 2016 1 0587156

(51) Int. Cl.
*G03F 1/64*     (2012.01)
*H01L 51/00*    (2006.01)
(Continued)

(52) U.S. Cl.
CPC .............. *G03F 1/64* (2013.01); *B05C 21/005* (2013.01); *C23C 14/042* (2013.01); *G03F 1/50* (2013.01);
(Continued)

(58) Field of Classification Search
None
See application file for complete search history.

(56) References Cited

U.S. PATENT DOCUMENTS

2003/0221614 A1* 12/2003 Kang .................... C23C 14/042
118/504
2004/0123799 A1  7/2004 Clark
(Continued)

FOREIGN PATENT DOCUMENTS

CN        1776525 A    5/2006
CN      102023474 A    4/2011
(Continued)

OTHER PUBLICATIONS

The International Search Report and Written Opinion dated May 19, 2017; PCT/CN2017/074403.
(Continued)

*Primary Examiner* — Jethro M. Pence

(57) ABSTRACT

A mask and a fabrication method thereof are provided. The mask includes: a frame, which includes a hollow portion and a border surrounding the hollow portion; an opening plate, which is provided on the frame and includes an opening and a body surrounding the opening, the opening corresponding to the hollow portion, and the body being connected with the border; and a pattern plate, which is provided on the opening plate and includes a pattern portion and a non-pattern portion positioned in a periphery of the pattern portion, the pattern portion corresponding to the opening, the non-pattern portion being connected with the body of the open-
(Continued)

ing plate, and the non-pattern portion and the frame being separated from each other at a position of the border.

15 Claims, 3 Drawing Sheets

(51) Int. Cl.
    *H01L 51/50*     (2006.01)
    *C23C 14/04*     (2006.01)
    *G03F 1/50*     (2012.01)
    *B05C 21/00*     (2006.01)

(52) U.S. Cl.
    CPC ...... *H01L 51/5012* (2013.01); *H01L 51/0011* (2013.01)

(56) References Cited

U.S. PATENT DOCUMENTS

| | | |
|---|---|---|
| 2006/0011137 A1 | 1/2006 | Keller |
| 2006/0103289 A1 | 5/2006 | Kim et al. |
| 2011/0067630 A1 | 3/2011 | Ko et al. |
| 2012/0234236 A1 | 9/2012 | Ko et al. |
| 2013/0089941 A1* | 4/2013 | Sonoda ................. C23C 14/042 438/46 |
| 2013/0314686 A1 | 11/2013 | Kim |
| 2013/0340680 A1* | 12/2013 | Sonoda ................. C23C 14/243 118/720 |
| 2015/0368785 A1 | 12/2015 | Nam et al. |
| 2016/0149134 A1 | 5/2016 | Inoue et al. |
| 2016/0343994 A1 | 11/2016 | Wu et al. |
| 2018/0230585 A1 | 8/2018 | Bai |

FOREIGN PATENT DOCUMENTS

| | | | |
|---|---|---|---|
| CN | 103207518 A | 7/2013 | |
| CN | 104419890 A | 3/2015 | |
| CN | 104536260 A | 4/2015 | |
| CN | 204832764 | * 12/2015 | ............... G03F 1/64 |
| CN | 204832764 U | 12/2015 | |
| CN | 105568217 A | 5/2016 | |
| CN | 106019819 A | 10/2016 | |
| EP | 2298952 A1 | 3/2011 | |

OTHER PUBLICATIONS

Extended European Search Report dated Mar. 13, 2020; Appln. No. 17743236.6.

* cited by examiner

MASK AND FABRICATION METHOD THEREOF

TECHNICAL FIELD

Embodiments of the present disclosure relate to a mask and a fabrication method of a mask.

BACKGROUND

A mask is used for producing a desired pattern, and is widely applied in the pattern fabrication process of various electronic products, e.g., a transistor, a liquid crystal panel, an organic light-emitting diode (OLED) panel and the like. Photolithography process and evaporation process are common technologies in the pattern fabrication process. For example, in the photolithography process, a thin film is exposed by utilizing the mask, and then processes of development, etching and the like are carried out to obtain the desired pattern. For example, in the evaporation process, a material is heated to a gaseous state and is deposited onto a substrate or a workpiece after penetrating the mask so as to obtain the desired pattern.

SUMMARY

According to embodiments of the disclosure, a mask is provided. The mask comprises: a frame, which includes a hollow portion and a border surrounding the hollow portion; an opening plate, which is provided on the frame and includes an opening and a body surrounding the opening, the opening corresponding to the hollow portion, and the body being connected with the border; and a pattern plate, which is provided on the opening plate and includes a pattern portion and a non-pattern portion positioned in a periphery of the pattern portion, the pattern portion corresponding to the opening, the non-pattern portion being connected with the body of the opening plate, and the non-pattern portion and the frame being separated from each other at a position of the border.

For example, a surface of the frame, which faces the pattern plate, is flat at a position where the surface overlaps the pattern plate.

For example, a portion of the pattern plate, which overlaps the border, is positioned in a region where the body of the opening plate is positioned.

For example, the opening plate includes a plurality of opening strips, the opening is provided in each opening strip, each opening strip extends along a first direction, the plurality of opening strips are sequentially arranged along a second direction, and the second direction intersects with the first direction.

For example, each opening strip includes a first thinned portion and a second thinned portion which are respectively positioned on two opposite sides of the opening strip, the first thinned portion and the second thinned portion are arranged along the second direction, the first thinned portion and the second thinned portion extend along the first direction, and adjacent thinned portions of adjacent opening strips overlap each other.

For example, a sum of thicknesses of the overlapped thinned portions is equal to a thickness of the opening strip.

For example, a width of each opening strip is 50 to 130 mm.

For example, the pattern plate includes a plurality of pattern strips, each pattern strip includes the pattern portion, each pattern strip extends along the first direction, and the plurality of pattern strips are sequentially arranged along the second direction.

For example, a width of each pattern strip is smaller than or equal to the width of the opening strip corresponding to the pattern strip.

For example, the pattern plate includes a plurality of pattern strips, each pattern strip extends along the first direction, the plurality of pattern strips are sequentially arranged along the second direction, and the second direction intersects with the first direction.

For example, a material for forming at least one of the opening plate and the pattern plate is an Invar alloy.

For example, an orthogonal projection of the pattern portion of the pattern plate on the opening plate is positioned in the opening.

According to the embodiments of the disclosure, a fabrication method of a mask is provided. The method comprises: providing an opening plate on a frame, wherein the frame includes a hollow portion and a border surrounding the hollow portion, the opening plate includes an opening and a body surrounding the opening, the opening corresponds to the hollow portion, and the body is connected with the border; and providing a pattern plate on the opening plate, wherein the pattern plate includes a pattern portion and a non-pattern portion positioned in a periphery of the pattern portion, the pattern portion corresponds to the opening, the non-pattern portion is connected with the body of the opening plate, and the non-pattern portion and the frame are separated from each other at a position of the border.

For example, the opening and the body of the opening plate are formed by carrying out a patterning process on a metal layer.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 2b is a partial schematic sectional view taken along an A-A line in FIG. 2a;

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects. Expressions such as "connect" or "interconnect" and the like are not limited to physical or mechanical connections, but may include electrical connections, whether direct or indirect. Expressions such as "up", "down", "left", "right" and the like are only used for expressing relative positional relationship, the relative positional relationship may be correspondingly changed in the case that the absolute position of a described object is changed.

Figure 1A:
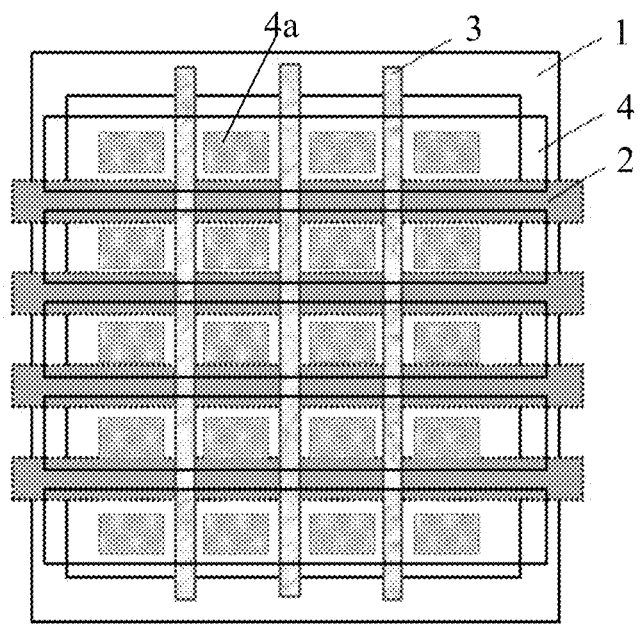
FIG. 1a is a schematic top view illustrating a metal mask according to one technique.

By taking a metal mask used in an evaporation process as an example, as shown in FIG. 1a, the metal mask includes a frame 1 and a shield strip 2, a support strip 3 and an active metal mask strip 4 which are provided on the frame 1. The active metal mask strip 4 is provided with a pattern portion 4a, the pattern portion 4a, for example, is an opening and is positioned in a region defined by intersection of the shield strip 2 and the support strip 3, and a material forms a desired pattern on a substrate after penetrating the pattern portion 4a of the active metal mask strip 4 in the evaporation process; the shield strip 2 is positioned between the adjacent active metal mask strips 4, and is used for blocking the material so as to prevent material permeation occurring between the adjacent active metal mask strips 4; and the support strip 3 is used for supporting the active metal mask strip 4 so as to prevent droop of the active metal mask strip 4 and/or reduce a droop quantity of the active metal mask strip 4.

Figure 1B:
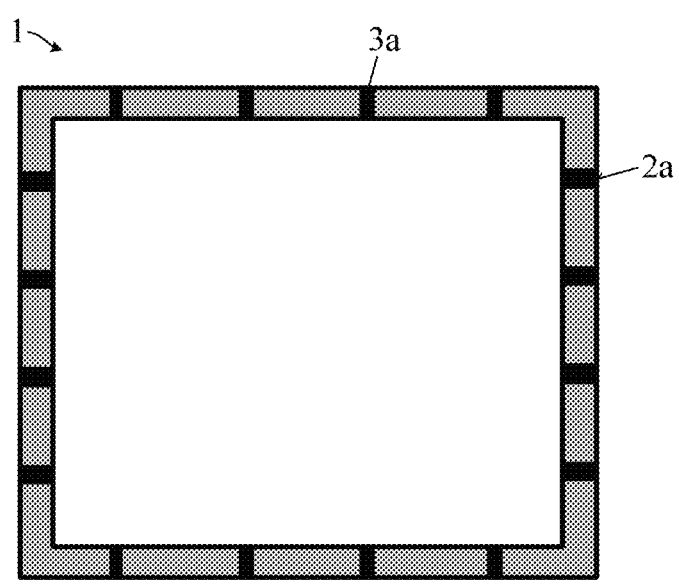
FIG. 1b is a schematic top view illustrating a frame which the metal mask in FIG. 1a includes.

A fabrication process of the metal mask shown in FIG. 1a for example includes: sequentially welding the shield strip 2 and the support strip 3 on the frame 1, and then welding the active metal mask strip 4 on the frame 1. The active metal mask strip 4 is provided on sides of the shield strip 2 and the support strip 3 which are far away from the frame 1; and thus, in order to avoid bending of the active metal mask strip 4 in the case that the active metal mask strip 4 is welded on the frame 1, which is caused by thickness influence of the shield strip 2 and the support strip 3, a shield welding groove 2a for accommodating the shield strip 2 and a support welding groove 3a for accommodating the support strip 3 need to be formed in the frame 1, as shown in FIG. 1b. However, in the case that a design of the product is changed, a width and a pitch of the active metal mask strip 4, a pitch between the adjacent support strips 3 and the like are needed to be changed correspondingly, so that the frame with the grooves 2a and 3a has to be discarded, thereby causing increase of production cost.

Figure 2A:
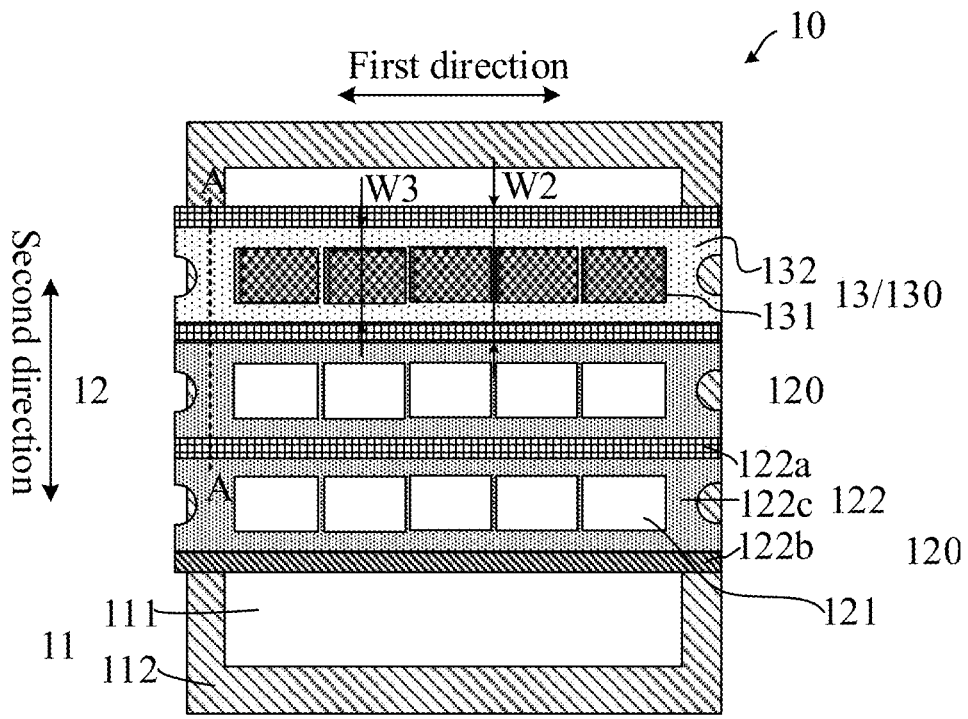
FIG. 2a is a schematic top view illustrating a mask provided by embodiments of the present disclosure.
Figure 2B:
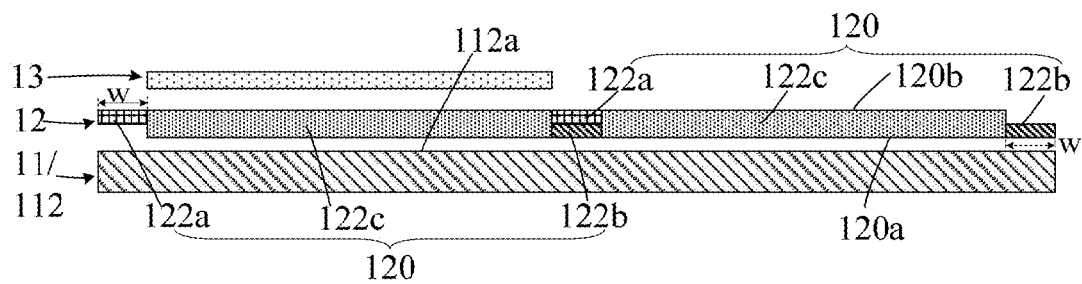

As shown in FIG. 2a and FIG. 2b, at least one embodiment of the present disclosure provides a mask 10, and the mask 10 includes a frame 11, an opening plate 12 provided on the frame 11 and a pattern plate 13 provided on the opening plate 12. The frame 11 includes a hollow portion 111 and a border 112 surrounding the hollow portion 111. The opening plate 12 includes an opening 121 and a body 122 surrounding the opening 121, the opening 121 corresponds to the hollow portion 111 of the frame 11, and the body 122 is connected with the border 112 of the frame 11 (for example, the body 122 is in welding connection with the border 112). The pattern plate 13 is stacked on the opening plate 12 and includes a pattern portion 131 and a non-pattern portion 132 positioned in the periphery of the pattern portion 131; the pattern portion 131 corresponds to the opening 121 of the opening plate 12 and an orthographic projection of the pattern portion 131 on the opening plate 12 is positioned in the opening 121 so as to avoid a case that the pattern portion 131 is shielded by the non-opening portion 122 of the opening plate 12; and the non-pattern portion 132 is connected with the body 122 of the opening plate 12 (for example, the non-pattern portion 132 is in welding connection with the body 122), and the non-pattern portion 132 and the frame 11 are separated from each other at a position of the border 112.

For example, a connection position (e.g., a welding position) of the non-pattern portion 132 of the pattern plate 13 and the body 122 of the opening plate 12 is positioned at the position of the border 112. For example, on such basis, both the pattern plate 13 and the opening plate 12 are of a planar structure, and thus, the connection position (e.g., the welding position) of the non-pattern portion 132 of the pattern plate 13 and the body 122 of the opening plate 12 is further positioned at a position of the hollow portion 111 of the frame 11 so as to improve connection reliability between the opening plate 12 and the pattern plate 13.

It should be noted that, the number of the opening 121 in the opening plate 12 is at least one and the number of the pattern portion 131 in the pattern plate 13 is at least one, and FIG. 2a is only used for exemplary illustration. For example, the mask provided by the embodiments of the present disclosure is the metal mask used in the evaporation process. By taking an organic evaporation film forming technology of an OLED as an example, each pattern portion 131 in the pattern plate 13 which the mask includes is used for producing a pattern of an organic light emitting layer of an OLED display panel. The pattern portion 131 of the pattern plate 13 includes a plurality of shield regions (shown as black grids in FIG. 2a) and a plurality of non-shield regions (shown as white grids in FIG. 2a), and the shield regions and the non-shield regions are provided alternatively; in the evaporation process of a material, the material penetrates the non-shield regions but cannot penetrate the shield regions, so that the material forms the desired pattern after penetrating the pattern portion 131 and being deposited onto the substrate. Certainly, the mask provided by the embodiments of the present disclosure may also be used for producing other types of display panels or other devices of which fabrication processes employs the mask.

In the embodiments of the present disclosure, the opening plate 12 takes an effect of supporting the pattern plate 13 and/or shielding the material in the evaporation process of the material. For example, in order to take the effect of supporting the pattern plate 13 to reduce a droop quantity of the pattern plate 13, the opening plate 12 is applied with a tensile force in the welding process, so that a droop quantity of the opening plate 12 is smaller than or equal to that of the pattern plate 13. For example, in order to take the effect of shielding the material in the evaporation process of the material, as shown in FIG. 2a, in a second direction, the pattern plate 13 is not beyond a region where the opening plate 12 is positioned.

For example, a thickness of the opening plate 12 is greater than that of the pattern plate 13 so as to enable the opening plate 12 to take the good supporting effect of supporting the pattern plate 13. For example, in consideration of cases that the excessively thin opening plate or pattern plate may increase the welding difficulty and the excessively thick opening plate or pattern plate may cause increase of the droop quantity of the opening plate or pattern plate, the thickness of the opening plate 12 is 30 to 100 micrometers, and/or the thickness of the pattern plate 13 is 15 to 40 micrometers.

For example, a material for forming at least one of the opening plate 12 and the pattern plate 13 is an Invar alloy, because the Invar alloy is stable in performance and has little influence on a thin film formed by evaporation. Certainly, the material for forming the opening plate 12 and the pattern plate 13 includes, but is not limited to the Invar alloy.

Figure 3:
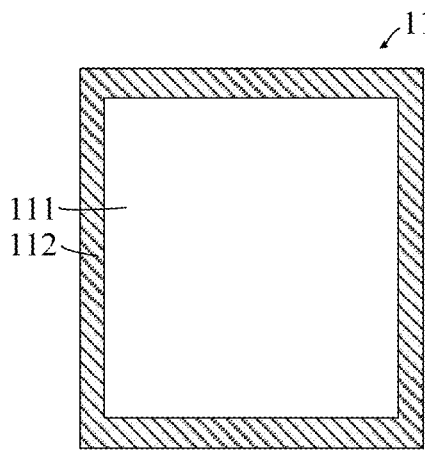
FIG. 3 is a schematic top view illustrating a frame which the mask provided by the embodiments of the present disclosure includes.

In the mask provided by the embodiments of the present disclosure, by connecting the opening plate and the frame, then connecting the pattern plate and the opening plate and enabling the non-pattern portion of the pattern plate and the frame to be separated from each other at the position of the border, the non-pattern portion is not in direct contact with the frame, and thus, a welding groove does not need to be formed in the frame. FIG. 3 is a schematic top view illustrating the frame which the mask provided by the embodiments of the present disclosure includes. As shown in FIG. 3, the shielding welding groove 2a and the supporting welding groove 3a as shown in FIG. 1b are not formed in the border 112 of the frame 11, so that a surface 112a of the frame 11, which faces the pattern plate 13, is flat at a any position where the surface 112a overlaps the pattern plate 13, as shown in FIG. 2b.

The welding groove is not formed in the frame which the mask provided by the embodiments of the present disclosure includes, and thus, fabricating cost of the welding groove can be saved; and the welding groove does not need to be formed in the frame, and the frame does not need to be designed and produced again in the case that the product design is changed, and thus, all types of masks can use the frame, which further saves production cost.

In at least one embodiment, the opening plate 12 is flat at the position of the border of the frame 11 so as to facilitate connecting the pattern plate 13 and the opening plate 12, and in this case, for example, as shown in FIG. 2a and FIG. 2b, a portion of the pattern plate 13, which overlaps the border 112, is positioned in a region where the body 122 of the opening plate 12 is positioned.

Figure 4A:
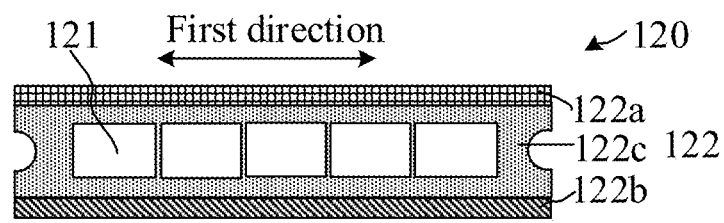
FIG. 4a is a schematic top view illustrating an opening strip in an opening plate which the mask provided by the embodiments of the present disclosure includes.

In at least one embodiment, as shown in FIG. 2a and FIG. 4a, the opening plate 12 for example includes a plurality of opening strips 120, the opening 121 (the number of the opening 121 is at least one) is provided in each opening strip 120 and each opening strip 120 extends along a first direction, the plurality of opening strips 120 are sequentially arranged along the second direction, and the second direction intersects with the first direction. By arranging a plurality of opening strips 120, in the case that a certain opening strip 120 is damaged, only the damaged opening strip 120 needs to be replaced without replacing the entire opening plate 12, so that production cost can be further saved.

Figure 5:
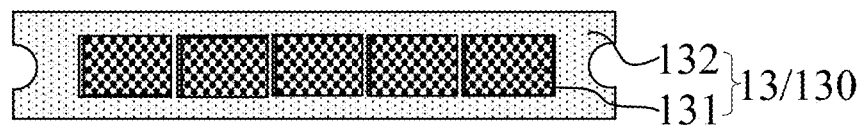
FIG. 5 is a schematic top view illustrating a pattern strip in a pattern plate which the mask provided by the embodiments of the present disclosure includes.

Similarly, as shown in FIG. 2a and FIG. 5, the pattern plate 13 for example includes a plurality of pattern strips 130, each pattern strip 130 is provided with the pattern portion 131 (the number of the pattern portion 131 is at least one) and extends along the first direction, and the plurality of pattern strips 130 are sequentially arranged along the second direction. In the case that a certain pattern strip 130 is damaged, the damaged pattern strip 130 only needs to be replaced for repair without replacing the entire pattern plate 13, so that production cost can be further saved. In the other aspect, in a case that both the pattern plate 13 and the opening plate 12 include a plurality of strip structures, due to design similarity of the pattern plate 13 and the opening plate 12, operation can be completed on the same net stowing machine (the net stowing machine enables the pattern strip and the opening strip to be fixed on the frame by a certain tension), so that cost of apparatus is saved.

In at least one embodiment of the present disclosure, as shown in FIG. 2a, a width W3 of each pattern strip 130 for example is smaller than or equal to a width W2 of the opening strip 120 corresponding to the pattern strip 130. Therefore, the opening strip 120 takes the effect of preventing material permeation between the adjacent pattern strips 130 in the evaporation process.

For example, in consideration of a case that the excessively small width of the strip may cause increase of the welding difficulty and in consideration the size of a currently common apparatus, the width of each opening strip 120 and the width of each pattern strip 130 for example is 50 to 130 mm.

For example, as shown in FIG. 2a, FIG. 2b and FIG. 4a, each opening strip 120 includes a first thinned portion 122a and a second thinned portion 122b which are respectively positioned on two opposite sides of the opening strip 120 and a portion 122c positioned between the first and second thinned portions, the first thinned portion 122a and the second thinned portion 122b are arranged along the second direction and extend along the first direction, and the adjacent thinned portions of the adjacent opening strips 120 overlap with each other in a direction perpendicular to a plate surface of the opening plate 12. By arranging the first and second thinned portions and enabling the adjacent thinned portions of the adjacent opening strips 120 to overlap with each other, material permeation between the adjacent pattern strips 130 of the pattern plate 13 can be prevented. Moreover, by arranging the thinned portions, the opening plate not only can support the pattern plate but also can achieve an effect of shielding the material, so that production of both of the shield strip 2 and the support strip 3 in the metal mask as shown in FIG. 1a can be omitted; and furthermore, both the supporting and shielding effects are achieved by the opening plate, and the opening plate and the pattern plate adopt similar strip design, and thus, compared to a mode of respectively adjusting and controlling the supporting and shielding effects in the metal mask shown in FIG. 1a, a mode adopted by the mask provided by the embodiments of the present disclosure is that the supporting and shielding effects can be synchronously adjusted and controlled.

Figure 4B:
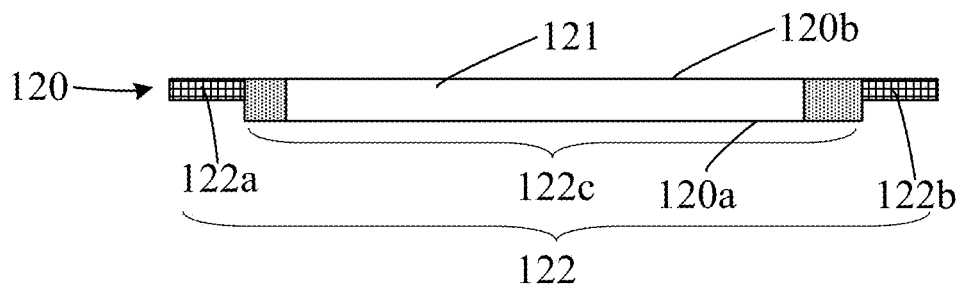
FIG. 4b is a schematic sectional view illustrating the opening strip in the opening plate which the mask provided by the embodiments of the present disclosure includes.

For example, both the first and second thinned portions are formed by etching a metal strip for forming the opening strip 120. For example, as shown in FIG. 2b, the first thinned portion 122a is formed by carrying out etching process on a surface 120a of the opening strip 120, which faces the frame 11, and the second thinned portion 122b is formed by carrying out etching process on a surface 120b of the opening strip 120, which faces away from the frame 11. Further, for example, as shown in FIG. 4b, both of the first thinned portion 122a and the second thinned portion 122b of the same opening strip 120 are formed by carrying out etching process on one of the surface 122a and the surface 122b of the opening strip (FIG. 4b takes a case that both the thinned portions are formed by carrying out etching process on the surface 122a as an example), as long as the adjacent thinned portions of the adjacent opening strips overlap with each other in a mode as shown in FIG. 2b.

In at least one embodiment, a sum of thicknesses of the overlapped thinned portions of the adjacent opening strips 120 is equal to a thickness of the opening strip 120, as shown in FIG. 2b. For example, the thicknesses of the first thinned portion and the thickness of the second thinned portion is half of the thickness of the opening strip 120. Certainly, the embodiments of the present disclosure include, but are not limited thereto. By setting the sum of the thicknesses of the overlapped thinned portions of the adjacent opening strips to be equal to the thickness of the opening strip, the surface of the opening plate, which faces the pattern plate, can be guaranteed to be flat, thereby avoiding a case that the pattern plate is bent after being connected with the opening plate.

In at least one embodiment, as shown in FIG. 2b, the width w of the first thinned portion 122a and the width w of the second thinned portion 122b (the width of the first thinned portion and the width of the second thinned portion may be equal or not) for example is 0.3 to 0.8 mm. Therefore, not only can the welding difficulty caused by the excessively narrow thinned portions be avoided, but also the opening strips 120 can be provided relatively compactly to improve a space utilization rate.

At least one embodiment of the present disclosure further provides a fabrication method of a mask. The method is used for producing the mask as shown in FIG. 2a and FIG. 2b for example. As shown in FIG. 2a and FIG. 2b, the fabrication method of the mask, which is provided by the embodiments of the present disclosure, includes: providing the opening plate 12 on the frame 11, the frame 11 including the hollow portion 111 and the border 112 surrounding the hollow portion 111, the opening plate 12 including the opening 121 and the body 122 surrounding the opening 121, the opening 121 corresponding to the hollow portion 111 of the frame 11, and the body 122 being connected with the border 112 of the frame 11; and providing the pattern plate 13 on the opening plate 12, the pattern plate 13 being stacked on the opening plate 12 and including the pattern portion 131 and the non-pattern portion 132 positioned in the periphery of the pattern portion 131, the pattern portion 131 corresponding to the opening 121, the non-pattern portion 132 being connected with the body 122 of the opening plate 12, and the non-pattern portion 132 and the frame 11 being separated from each other at the position of the border 112.

In the fabrication method of the mask, which is provided by the embodiments of the present disclosure, the opening plate is connected with the frame, then the pattern plate is connected with the opening plate, and the non-pattern portion of the pattern plate is separated from the frame at the position of the border, so that the non-pattern portion is not in direct contact with the frame, and thus, the welding groove does not need to be formed in the frame, resulting in that fabricating cost of the welding groove can be saved; and in addition, the welding groove does not need to be formed in the frame, and the frame does not need to be designed and produced again in the case that the product design is changed, and thus, all the types of masks can use the frame, which further saves production cost.

Figure 6:
FIG. 6 is a schematic sectional view of a metal layer provided by the embodiments of the present disclosure and used for fabricating an opening plate.

In at least one embodiment, the opening 121 and the body 122 of the opening plate 12 for example is formed by carrying out a patterning process on a metal layer 12a (as shown in FIG. 6), and in this case, the body 122 of the opening plate 12 is of an integral structure, with reference to FIG. 2b and FIG. 4b. The patterning process is a process for forming a desired pattern, and for example, includes a photolithography process or a laser etching process and the like. The photolithography process, for example, includes steps of photoresist coating, photoresist exposure, photoresist development, thin film etching by utilizing a photoresist pattern and the like.

In at least one embodiment, the opening plate 12 for example is in welding connection with the frame 11 and the pattern plate 13, i.e., the fabrication method of the mask, which is provided by the embodiments of the present disclosure, includes: welding the opening plate 12 on the frame 11, and then welding the pattern plate 13 on the opening plate 12. Certainly, other common connection methods in the art can also be adopted.

From the above, the mask and the fabrication method the mask, which are provided by the embodiments of the present disclosure, have advantages as follows.

(1) The welding groove is not formed in the frame which the mask includes, and thus, fabricating cost of the welding groove can be saved.

(2) The welding groove does not need to be formed in the frame, and thus, in the case that the product design is changed, all the types of masks can use the frame and only the opening plate and the pattern plate need to be designed again, which further save production cost.

(3) The supporting and shielding effects can be achieved by adopting one opening plate, so that steps of welding the shield strip and the support strip can be omitted.

(4) The opening plate or the pattern plate includes a plurality of strips, and in the case that a certain strip structure is damaged, only the damaged strip needs to be replaced without replacing the entire plate.

(5) The opening plate and the pattern plate adopt similar strip design, and thus, welding of the opening strip and the pattern strip can be completed on the same net stowing machine so as to save investment cost of the apparatus; and in addition, synchronous adjustment and control on the supporting and shielding effects of the opening plate can also be implemented.

The embodiments of the mask and the fabrication method thereof can refer to each other. Moreover, in case of no conflict, the embodiments of the present disclosure and features in the embodiments can be combined mutually.

The foregoing embodiments merely are exemplary embodiments of the disclosure, and not intended to define the scope of the disclosure, and the scope of the disclosure is determined by the appended claims.

The present application claims priority of the Chinese Patent Application No. 201610587156.3 filed on Jul. 22, 2016, the disclosure of which are incorporated herein by its reference in its entirety as part of the present application.

The invention claimed is:

1. A mask, comprising:
a frame, which includes a hollow portion and a border surrounding the hollow portion;
an opening plate, which is provided on the frame and includes an opening and a body surrounding the opening, the opening corresponding to the hollow portion, and the body being connected with the border; and
a pattern plate, which is provided on the opening plate and includes a pattern portion and a non-pattern portion positioned in a periphery of the pattern portion, the pattern portion corresponding to the opening, and the non-pattern portion being connected with the body of the opening plate, wherein the opening plate includes a plurality of opening strips, the opening is provided in each opening strip, each opening strip extends along a first direction, the plurality of opening strips are sequentially arranged along a second direction, and the second direction intersects with the first direction, and wherein at a position of the border of the frame, the border of the frame, the body of the opening plate and the non-pattern portion of the pattern plate overlap one another in a direction perpendicular to the mask, wherein at the position of the border of the frame, the body of the opening plate is between the border of the frame and the non-pattern portion of the pattern plate in the direction perpendicular to the mask so that the border of the frame is separated from the non-pattern portion of the pattern plate by the body of the opening plate, wherein each opening strip includes a first thinned portion and a second thinned portion which are respectively positioned on two opposite sides of the opening strip, the first thinned portion and the second thinned portion are arranged along the second direction, the first thinned portion and the second thinned portion extend along the first direction, and adjacent thinned portions of adjacent opening strips overlap each other, wherein the pattern plate includes a plurality of pattern strips, each pattern strip, includes the pattern portion each pattern strip extends along the first direction, and the plurality of pattern strips are sequentially arranged along the second direction, and wherein a width of each pattern strip is smaller than a width of the opening strip corresponding to the pattern strip in the second direction, and each pattern strip is provided between the first thinned portion and the second thinned portion of the opening, strip corresponding to the pattern strip in the second direction.

2. The mask according to claim 1, wherein a surface of the frame, which faces the pattern plate, is flat at a position where the surface overlaps the pattern plate.

3. The mask according to claim 1, wherein a portion of the pattern plate, which overlaps the border, is positioned in a region where the body of the opening plate is positioned.

4. The mask according to claim 1, wherein a sum of thicknesses of the overlapped thinned portions is equal to a thickness of the opening strip.

5. The mask according to claim 1, wherein a width of each opening strip is 50 to 130 mm.

6. The mask according to claim 1, wherein a material for forming at least one of the opening plate and the pattern plate is an Invar alloy.

7. The mask according to claim 1, wherein an orthogonal projection of the pattern portion of the pattern plate on the opening plate is positioned in the opening.

8. A fabrication method of a mask, comprising:
providing an opening plate on a frame, wherein the frame includes a hollow portion and a border surrounding the hollow portion, the opening plate includes an opening and a body surrounding the opening, the opening corresponds to the hollow portion, and the body is connected with the border; and
providing a pattern plate on the opening plate, wherein the pattern plate includes a pattern portion and a non-pattern portion positioned in a periphery of the pattern portion, the pattern portion corresponds to the opening, and the non-pattern portion is connected with the body of the opening plate, wherein the opening plate includes a plurality of opening strips, the opening is provided in each opening strip, each opening strip extends along a first direction, the plurality of opening strips are sequentially arranged along a second direction, and the second direction intersects with the first direction, wherein at a position of the border of the frame, the border of the frame, the body of the opening plate and the non-pattern portion of the pattern plate overlap one another in a direction perpendicular to the mask, wherein at the position of the border of the frame, the body of the opening plate is between the border of the frame and the non-pattern portion of the pattern plate in the direction perpendicular to the mask so that the border of the frame is separated from the non-pattern portion of the pattern plate by the body of the opening plate, wherein each opening strip includes a first thinned portion and a second thinned portion which are respectively positioned on two opposite sides of the opening strip, the first thinned portion and the second thinned portion are arranged along the second direction, the first thinned portion and the second thinned portion extend along the first direction, and adjacent thinned portions of adjacent opening strips overlap each other, wherein the pattern plate includes a plurality of pattern strips, each pattern strip includes the pattern portion, each pattern strip extends along the first direction, and the plurality of pattern strips are sequentially arranged along the second direction, and wherein a width of each pattern strip is smaller than a width of the opening strip corresponding to the pattern strip in the second direction and each pattern strip is provided between the first thinned portion and the second thinned portion of the opening corresponding to the pattern strip in the second direction.

9. The fabrication method according to claim 8, wherein the opening and the body of the opening plate are formed by carrying out a patterning process on a metal layer.

10. The mask according to claim 1, wherein an entirety of a surface of the frame, which faces the pattern plate, is flat.

11. The mask according to claim 1, wherein the pattern portion of the pattern plate comprises an opening region.

12. The mask according to claim 1, wherein the pattern portion of the pattern plate comprises a plurality of shield regions and a plurality of non-shield regions provided within the pattern portion, and the plurality of shield regions and the plurality of non-shield regions are provided alternatively.

13. The mask according to claim 1, wherein the body of the opening plate is of an integral structure.

14. The mask according to claim 1, wherein the frame includes only one hollow portion.

15. The mask according to claim 1, wherein each pattern strip does not overlap the first thinned portion and the second thinned portion of the opening strip corresponding to the pattern strip in the direction perpendicular to the mask.

* * * * *